US012685194B2

(12) United States Patent (10) Patent No.: US 12,685,194 B2
Ecton et al. (45) Date of Patent: Jul. 14, 2026

(54) MULTICHIP IC DEVICES IN GLASS MEDIUM AND INCLUDING AN INTERCONNECT BRIDGE DIE

(71) Applicant: Intel Corporation, Santa Clara, CA (US)

(72) Inventors: Jeremy Ecton, Gilbert, AZ (US); Brandon Marin, Gilbert, AZ (US); Srinivas Pietambaram, Chandler, AZ (US); Hiroki Tanaka, Gilbert, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 484 days.

(21) Appl. No.: 17/957,783

(22) Filed: Sep. 30, 2022

(65) Prior Publication Data

US 2024/0113029 A1 Apr. 4, 2024

(51) Int. Cl.
H10W 70/65 (2026.01)
H10W 70/05 (2026.01)
(Continued)

(52) U.S. Cl.
CPC ......... H10W 70/65 (2026.01); H10W 70/095 (2026.01); H10W 70/611 (2026.01); H10W 70/614 (2026.01); H10W 70/68 (2026.01); H10W 70/692 (2026.01); H10W 90/00 (2026.01); H10W 90/401 (2026.01); H10W 70/60 (2026.01); H10W 70/682 (2026.01);
(Continued)

(58) Field of Classification Search
CPC . H01L 25/112; H01L 25/071; H01L 25/0652; H01L 23/15; H01L 23/5389; H01L 23/5386; H01L 23/5381; H01L 2924/15788; H01L 2924/15153; H01L 25/042; H01L 25/0655; H01L 25/072; H01L 25/0753; H01L 25/115; H10W 70/65; H10W 70/095; H10W 70/611; H10W 70/692; H10W 90/00; H10W 90/401; H10W 70/60
See application file for complete search history.

(56) References Cited

U.S. PATENT DOCUMENTS 9,761,559 B1 * 9/2017 Shih ..................... H01L 25/0652
2020/0006235 A1 * 1/2020 Aleksov ............. H01L 23/5386
(Continued)

*Primary Examiner* — Julio J Maldonado
*Assistant Examiner* — Nathan Pridemore
(74) *Attorney, Agent, or Firm* — Essential Patents Group, LLP

(57) ABSTRACT

Multi-die packages including at least one glass substrate within a space between two adjacent IC dies or surrounding an interconnect bridge die. The various IC dies may be placed within recesses formed in the glass substrate. The IC die and glass substrate, along with any conductive vias extending through the glass substrate may be planarized. The bridge die may be directly bonded or soldered to the adjacent IC dies, providing fine pitch interconnect. The opposite side of the adjacent IC dies and glass substrate may be attached to a host component or may be built up with package dielectric material. Metallization features formed on the second side of the glass substrate may electrically interconnect the IC dies to package interconnect interfaces that may be further coupled to a host with solder interconnects.

18 Claims, 8 Drawing Sheets

(51) Int. Cl.

| | | |
|---|---|---|
| *H10W 70/60* | (2026.01) | |
| *H10W 70/68* | (2026.01) | |
| *H10W 70/692* | (2026.01) | |
| *H10W 90/00* | (2026.01) | |

(52) U.S. Cl.
CPC ........ *H10W 90/728* (2026.01); *H10W 90/798* (2026.01)

(56) References Cited

U.S. PATENT DOCUMENTS

| | | | | |
|---|---|---|---|---|
| 2020/0303313 A1* | 9/2020 | Leitgeb | ................ | H05K 1/0271 |
| 2022/0320028 A1* | 10/2022 | Li | ........................... | H01L 24/73 |
| 2023/0207439 A1* | 6/2023 | Elsherbini | ............... | H01L 24/19 257/774 |

* cited by examiner

101

MULTICHIP IC DEVICES IN GLASS MEDIUM AND INCLUDING AN INTERCONNECT BRIDGE DIE

BACKGROUND

Monolithic integrated circuit (IC) fabrication has restrictions that may limit a final product's performance, and thus different versions of IC die disaggregation are being investigated. To date however, these techniques and architectures generally suffer from certain drawbacks such as high cost, lower insertion efficiency, and increased z-height.

In electronics manufacturing, IC packaging is a stage of semiconductor device fabrication in which an IC that has been monolithically fabricated on a chip (or die) comprising a semiconducting material is assembled into a "package" that can protect the IC chip from physical damage and support electrical contacts that connect the IC to a scaled host component, such as an organic package substrate, or a printed circuit board. Multiple chips can be similarly assembled, for example, into a multi-chip package (MCP).

The electrical interconnection between multiple IC dies is important to ensure device performance is sufficient as die-to-die communication demands can be significantly higher than die-to-host demands Die-to-die interconnection may be achieved with an embedded die that hosts the interconnect routing. One motivation behind such a solution is that organic dielectric material employed within most packages suffers from high total thickness variation (TTV) and, thus, necessitates a large depth of focus (DOF), which ultimately limits the resolution of lithography employed to defined interconnect features within a package.

However, one significant challenge with embedding an interconnect bridge die is the requirement to embed the die inside a cavity and encapsulate. Another challenge is that die-to-die communication relies heavily on the bump pitch of the interconnect bridge die, which is ultimately limited by the relative bump thickness variation (rBTV) of solder bumps.

Alternative bridge die packaging architectures that can improve electrical performance and reduce bump pitch, enabling more die-to-die connections may be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
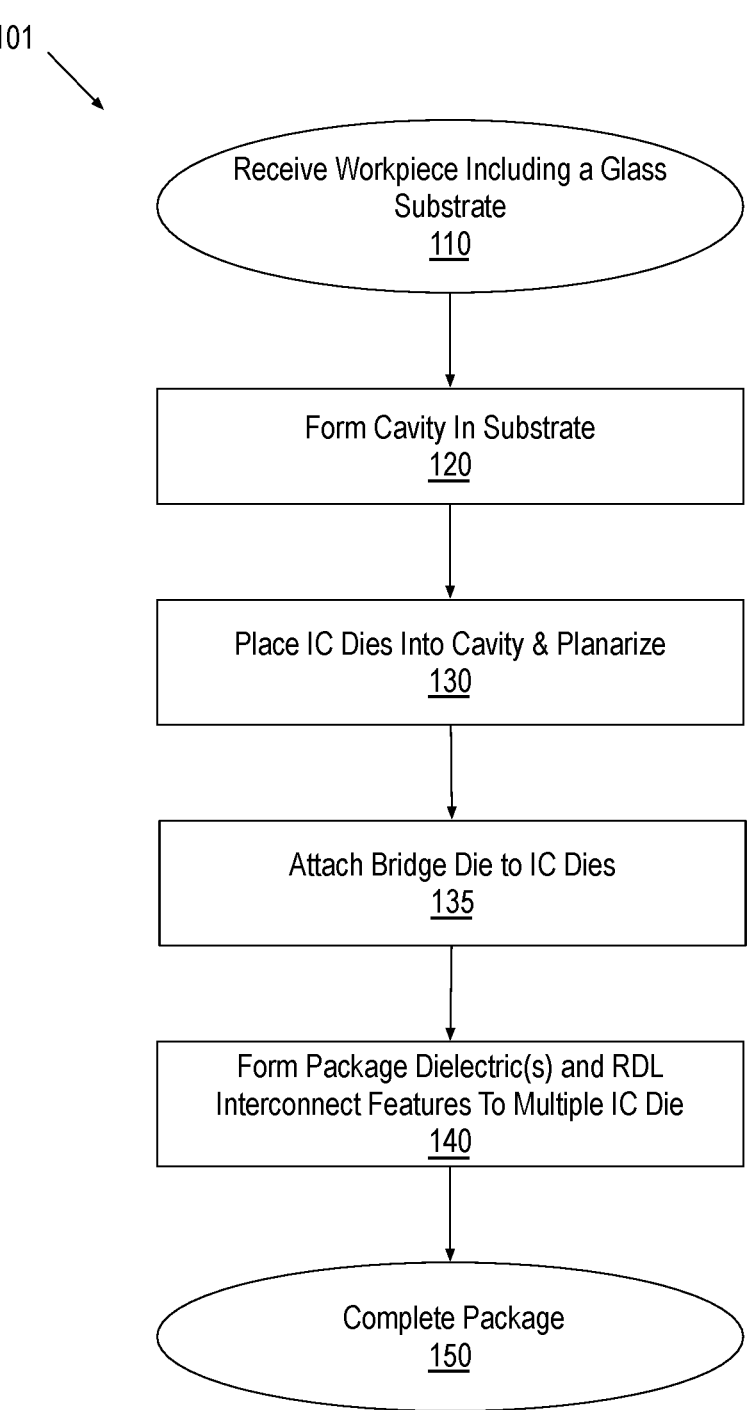
FIG. 1 illustrates a flow diagram of methods for forming a multi-chip device structure including a glass substrate and an interconnect bridge die with redistribution interconnect layers, in accordance with some embodiments.

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

Multi-chip device structures including multiple IC dies interconnected to each other through an interconnect bridge die (i.e., a silicon bridge) are described herein. One or more of the interconnect bridge die and IC dies interconnected by the bridge die are embedded in a glass substrate. As the glass substrate has flatness and/or thickness control superior to organic substrates (e.g., low TTV) with good dimensional stability, the bridge die may be coupled to the IC dies through either solder or direct (e.g., hybrid) bonding. In some embodiments, redistribution layer (RDL) metallization on an opposite side of the one or more glass substrates may interconnect the IC dies to a device host component (e.g., through solder features). The glass substrate may also, in some embodiments, facilitate optical interconnection to one or more of the IC dies, for example with an optical waveguide patterned directly in the glass medium.

Multi-chip device structures may be fabricated according to a "die first" approach with the IC dies first embedded within a cavity of a glass substrate. Following planarization, an interconnect bridge die may be bonded to the IC dies, spanning a portion of the glass substrate. The bridge die may itself have been embedded within a glass substrate, or, alternatively, the bridge die may be encapsulated in a package dielectric material after die attach. Organic packaging dielectric(s) may then be applied to a side of the IC dies opposite the bridge die. The packaging dielectric(s) may be patterned and plated with metallization to directly form package-to-host (e.g., first level) interconnect interfaces. A variety of fabrication methods may be practiced to form multi-chip device structures having one or more of the features or attributes described herein. FIG. 1 illustrates a flow diagram of methods 101 for forming a multi-chip device structure including a glass substrate with a bonded bridge die and redistribution layer metallization, in accordance with some embodiments.

Methods 101 begin at input 110 with the receipt of a glass substrate that has been fabricated upstream of methods 101. The glass substrate comprises at least a glass medium. The glass substrate advantageously has a flatness comparable to that of silicon wafers, and may have large dimensions suitable for large format panel processing, etc. The glass substrate may be supported by a carrier or handle substrate, such as any of those known to be suitable in the industry.

Figure 2:
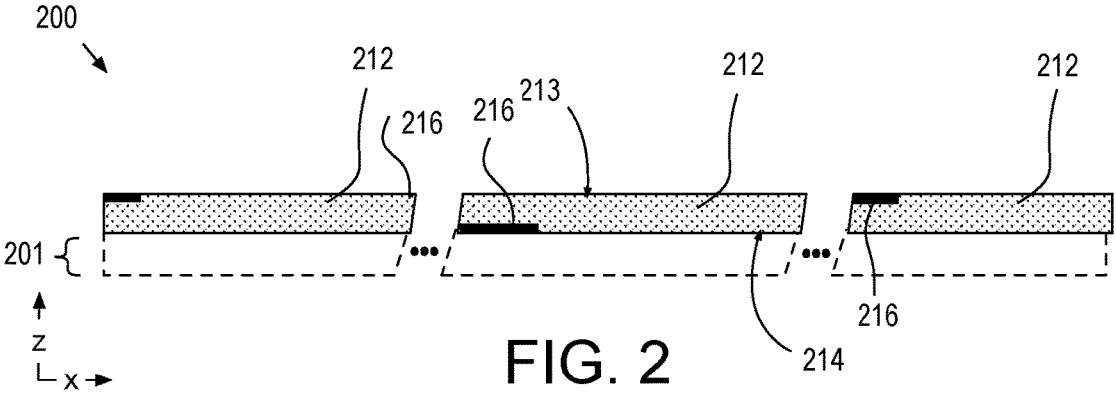
FIGS. 2 and 3A illustrate cross-sectional views of a workpiece with a plurality of multi-chip devices evolving as operations in the methods illustrated in FIG. 1 are practiced, in accordance with some embodiments.

In the example illustrated in FIG. 2, a workpiece 200 comprises a glass substrate 212 adhered, or otherwise affixed, to a carrier 201. Glass substrate 212 may consist of only glass, or it may have one or more thin film material layers on one or both of a front side or back side of the glass medium. Glass substrate 212 is advantageously predominantly silica (e.g., silicon and oxygen). Any dopants (e.g., boron, phosphorus) may be present in the glass medium (e.g., borosilicate glass, etc.) as embodiments herein are not limited in this respect.

Although not depicted, one or more material may clad either or both of the top side 213 or bottom side 214 of glass medium. Exemplary cladding materials include silicon nitride ($SiN_x$) or silicon oxynitride ($SiO_xN_y$). In other embodiments, a silicon layer (polycrystalline or monocrystalline) may clad one or both sides of a glass medium as part of glass substrate 212. Optionally, as further illustrated in FIG. 2, glass substrate 212 may have patterned features, such as one or more optical waveguides 216 on one or more of top or bottom sides 213, 214.

Returning to FIG. 1, methods 101 continue at block 120 where one or more cavities are formed in the glass substrate. Each cavity is to host one or more IC dies and is dimensioned accordingly. The glass may be patterned at block 120 according to any methods known to be suitable for the material. Alternatively, the glass received at input 110 is a preform that already includes cavities fabricated upstream of methods 101.

In some embodiments, each cavity is mechanically milled into the glass. In other embodiments, each cavity is formed with a laser, for example through the ablation of glass or some modification of the glass that renders it susceptible to etch. In still other embodiments, each cavity is formed with a masked etch process, which may either comprise a dry plasma or wet chemical etch.

Figure 3A:
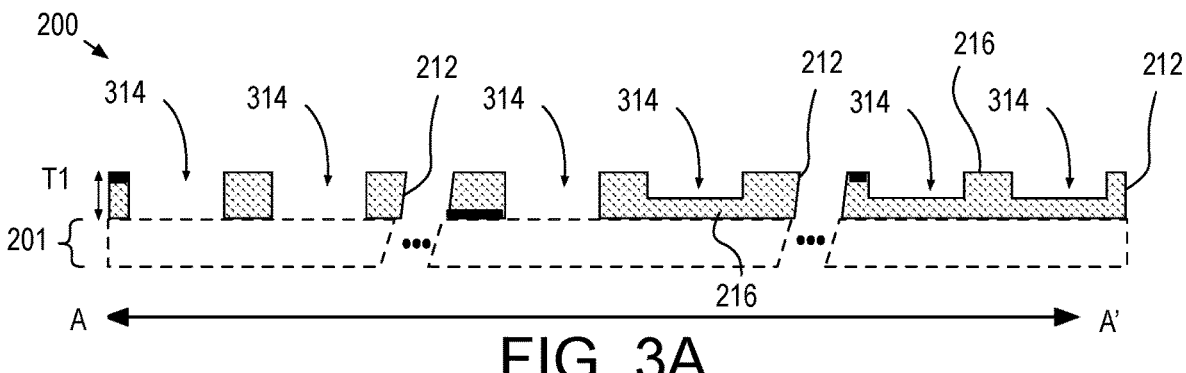
Figure 3B:
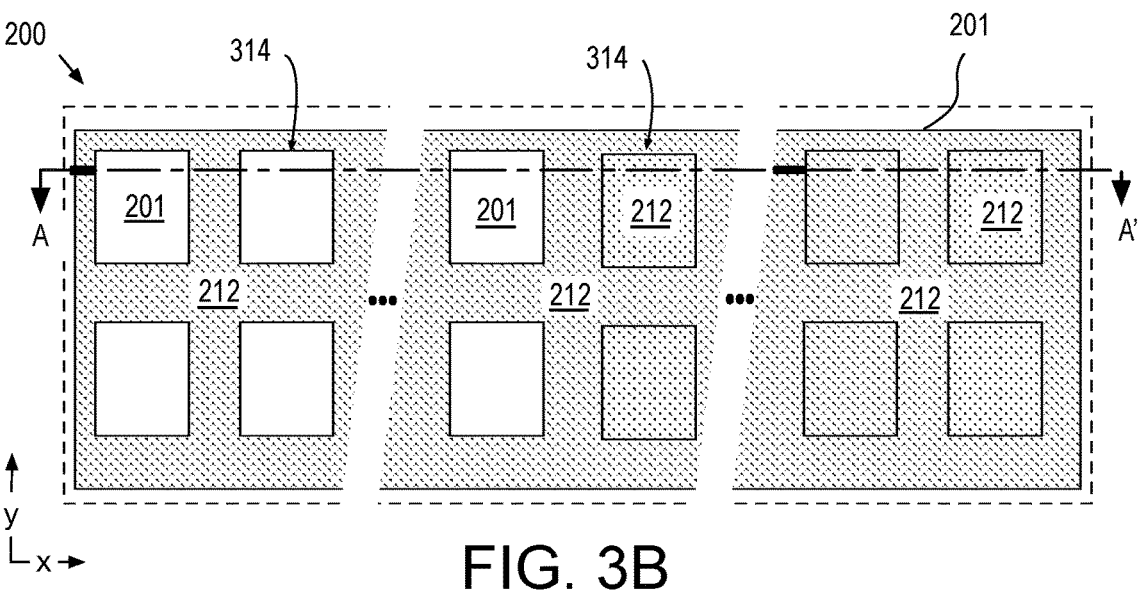
FIG. 3B illustrates a plan view of the workpiece illustrated in FIG. 3A, in accordance with some embodiments.

Cavities within the glass substrate may extend through an entire thickness of the glass medium (i.e., through holes) or may extend through only a partial thickness of the glass medium (i.e., a recessed surface). In the examples further illustrated in FIG. 3A, some cavities 314 extend from substrate top surface 213 through an entire thickness T1 of glass substrate 212 to expose carrier 201. While other cavities 314 are illustrated as being recessed into top surface 213 to a depth less than substrate thickness T1 so that no portion of carrier 201 is exposed by the cavity. Such variations between cavities may not be implemented within a single workpiece, but are nevertheless so illustrated in FIG. 3A for the sake of clarity. FIG. 3B further illustrates a plan view showing a footprint of cavities 314 arrayed over an area of glass substrate 212.

Returning to FIG. 1, methods 101 continue at block 130 where one or more IC dies is placed within a cavity. Hence, the IC dies are embedded within the cavities in the glass medium rather than merely attached to a planar frontside or backside surface of a glass medium. Accordingly, a sidewall edge of the IC die is adjacent to a sidewall edge of the glass medium. In some examples, at block 130 a pick-and-place machine positions IC dies within the cavities. Any permanent or temporary adhesive or bond film known to be suitable for die attach (e.g., a thermoset) may be employed to hold an IC die within a cavity during subsequent processing.

As the dimensions of the cavity are larger than those of the IC die to accommodate placement error, a gap between a sidewall of the glass medium and a sidewall of the IC die may be filled with any suitable filler, such as a dielectric material. The filler may be a mold compound, for example. The filler may also be another organic dielectric material, for example applied wet and cured, or applied as a dry film. Exposed surfaces of the assembly may then be planarized, for example with a grind or polish process suitable for the composition of the IC die and glass medium.

Figure 4A:
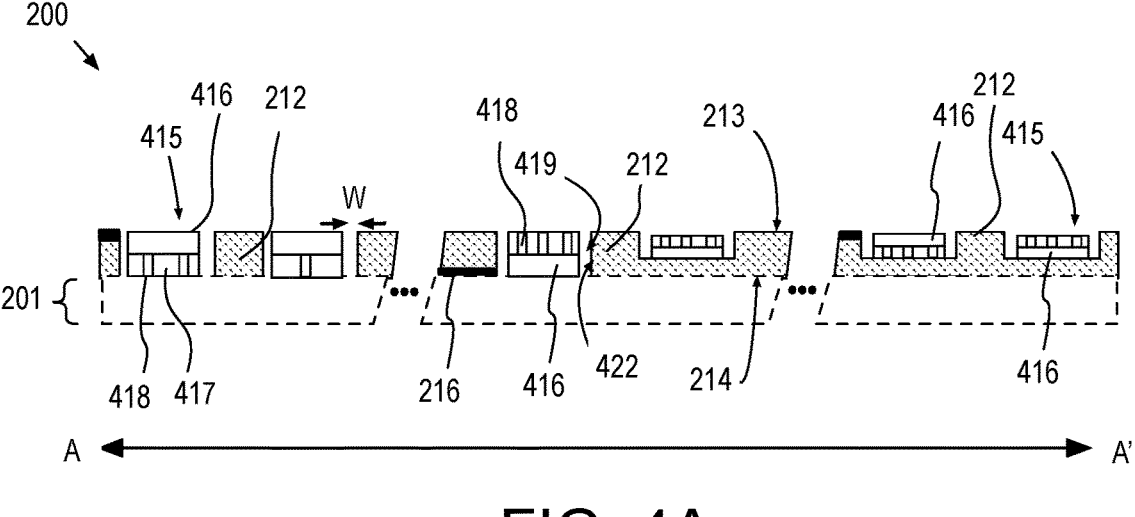
FIG. 4A illustrates a cross-section view of the workpiece evolving as operations in the methods illustrated in FIG. 1 are practiced, in accordance with some embodiments.

As a "die-first" method, the IC die attached at block 130 may be a plurality of IC die that are to be interconnected by an interconnect bridge die with the interconnect bridge die then to be subsequently attached. Alternatively, the interconnect bridge die may be attached at block 130 and the plurality of IC die to be interconnected by the interconnect bridge die subsequently attached. FIG. 4A illustrates an example of the former.

In FIG. 4A, one IC die 415 is located within each cavity 314 and therefore embedded within glass substrate 212. A bond film (not depicted) may be between IC die 415 and a bottom of cavity 314 (glass substrate 212 or carrier 201). A number of different thick die and thin die examples are illustrated in FIG. 4A. As shown, a thin die may be placed in a recess of lesser depth than thick die. Alternatively, instead of accommodating IC die of different thickness with cavities of differing depths, all cavities may instead be sufficient (e.g., a full thickness of glass medium) to accommodate a thickest IC die and glass substrate top surface 213 will stand proud of surfaces of IC dies 415 may be varying amounts. In the examples illustrated in FIG. 4A, all IC dies 415 have a thickness less than substrate thickness T1 or less than a depth of their corresponding cavity 314 so that substrate top surface 213 stands proud of IC dies 415 by at least some non-zero amount. However, particularly if the IC die is instead flip-chip assembled into the cavities, the IC die may stand proud of glass substrate 212 and be subsequently planarized.

In the example illustrated in FIG. 4A, each IC die 415 has IC layers 416 on a front side of IC die 415 and further comprises an IC die substrate material 417 on a back side of IC die 415. In some examples, IC die substrate material 417 is silicon. In other examples, IC die substrate material 417 is an alternative crystalline material, such as, but not limited to, germanium, $Si_xGe_{1-x}$, $Ge_xSn_{1-x}$, or silicon carbide.

IC die 415 may be assembled to carrier 201 "front-side up," so that IC layers 416 are distal from carrier 201. In alternative embodiments, IC die 415 may be flip-chip assembled "front-side down" so that IC layers 416 are instead proximal to carrier 201. Examples of both front-side up and front-side down assembly are illustrated in FIG. 4A. However, as noted above, such alternative may be integrated together into a single workpiece and/or multi-chip device, or not.

Figure 4B:
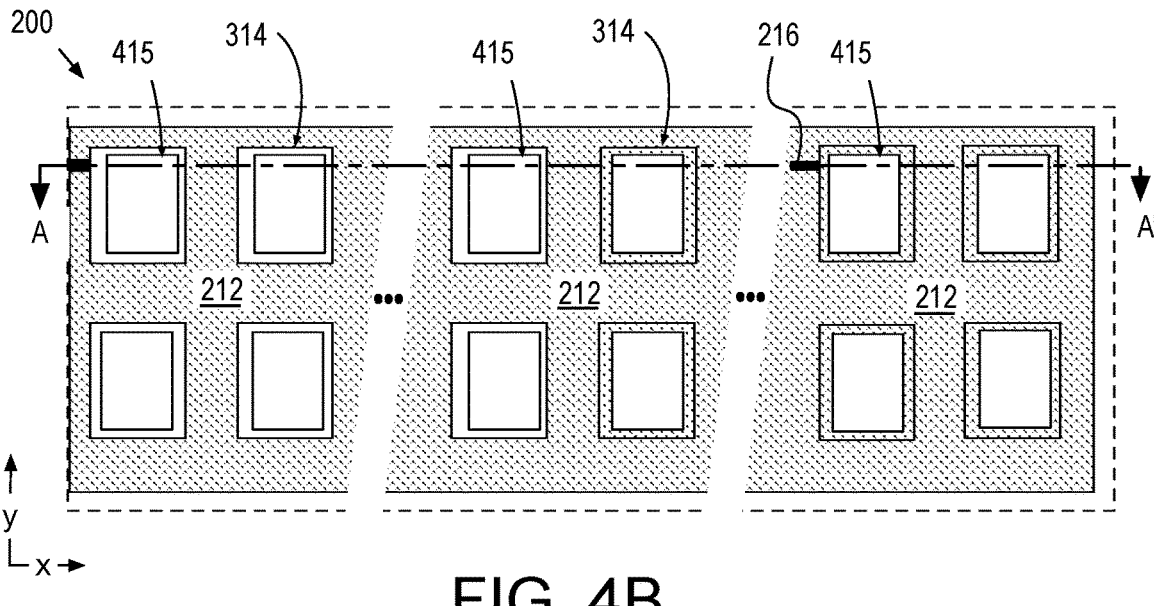
FIG. 4B illustrates a plan view of the workpiece illustrated in FIG. 4A, in accordance with some embodiments.

Glass substrate 212, as illustrated in an x-y plane in FIG. 4B, may surround each IC die 415, for example forming a perimeter about the edges of one IC die 415. Alternatively, more than one IC die 415 may be located within a single cavity 314. In the examples shown in FIGS. 4A and 4B, IC die 415 have been placed within cavities 314 so a die edge sidewall 419 is laterally adjacent to a sidewall 422 of glass substrate 212. A gap of width W is between die edge sidewall 419 and glass medium sidewall 422. Gap width W may vary, for example from 100 nm to several microns.

IC die 415 may have any architecture. In the illustrated embodiments, each IC die 415 is an "active" IC die with one or more types of active devices within IC layers 416. Such active devices may be fabricated into a surface of IC die substrate material 417, or not (e.g., instead part of a transferred substrate). IC layers 416 may include any semiconductor material such as, but not limited to, predominantly silicon (e.g., substantially pure Si) material, predominantly germanium (e.g., substantially pure Ge) material, or a compound material comprising a Group IV majority constituent (e.g., SiGe alloys, GeSn alloys). In other embodiments, IC layers 416 include a Group III-V material comprising a Group III majority constituent and a Group IV majority constituent (e.g., InGaAs, GaAs, GaSb, InGaSb). IC layers 416 may have a thickness of 50-1000 nm, for example. IC layers 416 need not be continuous layers, but rather may include active regions of semiconductor material surrounded by field regions of isolation dielectric.

In some embodiments, the active devices within IC layers 416 are field effect transistors (FETs) with a device pitch of 80 nm, or less. The FETs may be of any architecture (e.g., planar, non-planar, single-gate, multi-gate, stacked nanosheet, etc.). In some embodiments, FET terminals have a feature pitch of 20-40 nm. Additionally, or in the alternative, IC layers 416 may include active devices other than FETs. For example, IC layers 416 may include electronic memory structures, such as magnetic tunnel junctions (MTJs), capacitors, or the like.

IC die 415 may comprise one or more IC die metallization levels on either side of IC die 415. In exemplary embodiments, IC layers 416 include metallization features embedded within an insulator. While the IC die metallization features may have any composition(s) of sufficient electrical conductivity, in exemplary embodiments, the IC die metallization features are predominantly copper (Cu). In other examples, the metallization features are predominantly other than Cu, such as, but not limited to predominantly Ru, or predominantly W. An uppermost one of the metallization features within IC layers 416 may have a feature pitch ranging from 100 nm to several microns, for example.

In the illustrated example, each IC die 415 further includes one or more through die substrate vias (TSVs) 418 extending from die backside surface 214 through IC die substrate material 417. IC die TSVs 418 couple with IC layer 416, for example contacting one or more metallization features and/or terminals of active or passive devices. IC die TSVs 418 may have any architecture and generally include a metallization, such as, but not limited to, Cu.

Each of IC dies 415 may therefore be a fully functional ASIC, or may be a chiplet or tile that has more limited functionality supplementing the function of one or more other IC dies that are to be part of the same multi-chip device. A chiplet or tile may, for example, be any of a wireless radio circuit, microprocessor core, electronic memory circuit, floating point gate array (FPGA), power management and/or power supply circuit, or include a MEMS device. In some examples, one or more of IC dies 415 include one or more banks of active repeater circuitry to improve multi-chip interconnects (e.g., network-on-chip architectures). In other examples, one or more of IC dies 415 includes clock generator circuitry or temperature sensing circuitry. In other examples, one or more of IC dies 415 include logic circuitry that, along with other IC dies 415 implement 3D logic circuitry (e.g., mesh network-on-chip architectures). In still other examples, at least one of IC dies 415 includes microprocessor core circuitry, for example comprising one or more shift registers. In another example, at least one of IC die 415 is a photonic IC (PIC), for example comprising one or more optical waveguides, optical multiplexer/demultiplexer, lasers and/or photodetectors. For some such embodiments, the glass substrate 212 conveys optical signals to/from IC die 415 with optical waveguide 216.

Figure 5:
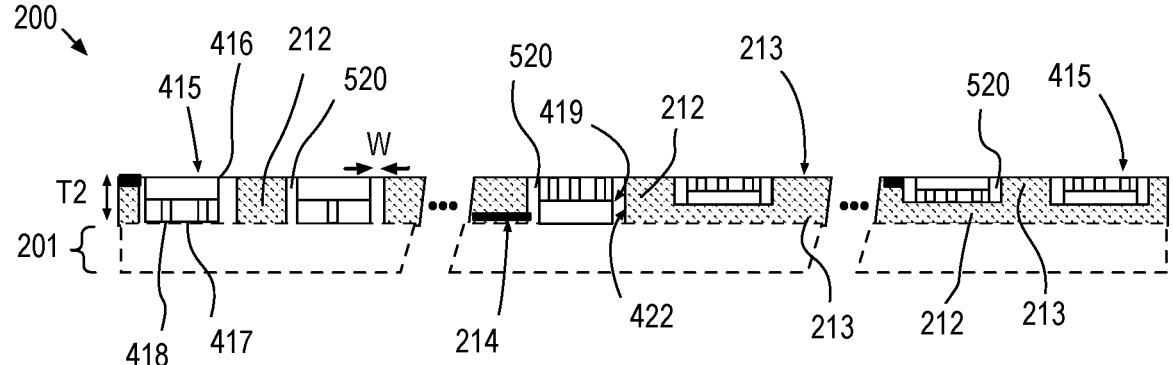
FIGS. 5, 6A, 6B, 7, 8, and 9 illustrate cross-sectional views of a workpiece with a plurality of multi-chip devices evolving as operations in the methods illustrated in FIG. 1 are practiced, in accordance with some embodiments.

FIG. 5 further illustrates workpiece 200 after application of a filler 520 followed by planarization of the front-side surface of workpiece 200. As shown, filler 520 may be retained within the gap between die edge sidewall 419 and glass sidewall 422 while any overburden may be removed during planarization. An amount of filler 520 may also be retained over a surface of thin IC die that are recessed well below glass substrate 212.

For the illustrated embodiment where IC die 415 are "front-side up," planarization may stop upon exposing an uppermost one of IC layers 416. For alternative embodiments where IC die 415 are "front-side down," planarization may remove any amount of IC die substrate material 417 desired, for example to planarize IC die of different thickness, etc. The planarization process may also reduce the thickness of glass substrate 212 to a final thickness T2 that is substantially equal to a thickness of at least one of the IC dies 415.

Filler 520 may have any composition and may be applied to workpiece 200 according to any technique suitable for the material. Filler 520 is advantageously an electrical insulator. In some examples, filler 520 is an organic dielectric, for example comprising an epoxy or polyimide. The organic dielectric may be applied, for example, with a molding process. In other embodiments, filler 520 is an inorganic dielectric material and may have composition known to be suitable as an insulator of monolithic integrated circuitry, such as, but not limited to, silicon dioxide, silicon nitride, silicon oxynitride, or a low-k material having a relative permittivity below 3.5. Inorganic dielectric materials may be deposited with any techniques known to be suitable, such as, but not limited to chemical vapor deposition (CVD).

For embodiments where a thin IC die 415 is recessed within a cavity that does not extend through the glass substrate thickness T2, addition TGVs 525 may extend through any partial thickness of glass substrate 212 to reveal interconnect features on the thin IC die 415. TGVs 525 may also have any architecture and generally include a metallization, such as, but not limited to, Cu. TGVs 525 may also be fabricated as part of methods 101 (FIG. 1) or may be prefabricated in the glass substrate received as an input to methods 101. TGVs 525 may be formed, for example, with a milling, ablation, or etching process similar to any that may be enlisted to form the IC die cavities within glass substrate 212. Metallization may be then deposited in the through via openings, for example with a plating process.

Returning to FIG. 1, methods 101 continue at block 135 where an interconnect bridge die is attached to the IC dies. The interconnect bridge die includes interconnect metallization, for example that has been fabricated with a back-end-of-line (BEOL) monolithic manufacturing process. The interconnect bridge die may be attached at block 135 according to any techniques for die-to-die coupling know to be suitable for IC die stack, for example. In some exemplary embodiments, the interconnect bridge die is directly bonded, for example to with a hybrid bonding process, to interconnect features on a surface of each of multiple IC dies assembled at block 130. In some other embodiments, the interconnect bridge die is indirectly bonded, for example with a solder bonding process, to interconnect features on a surface of each of multiple IC dies assembled at block 130.

Figure 6A:
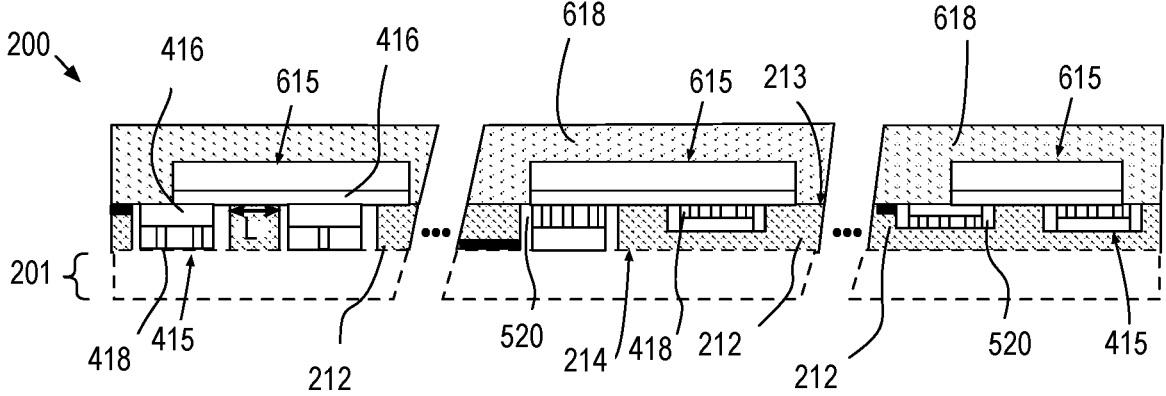

In the example illustrated in FIG. 6A, an interconnect bridge die 615 has been directly bonded to surfaces of IC die 415. In some exemplary embodiments, bridge die 615 is a "passive" die and lacks any FETs fabricated within IC layer 416. Such passive die may merely include interconnect routing level, for example resulting from any backend of line monolithic die fabrication process. In addition to in bridge die 615 may include devices such as resistors, capacitors, or inductors (not depicted). Bridge die 615 may have edge length to overlap a portion of two or more IC dies 415. Bridge die 615 therefore spans a length L of glass substrate 212 between two laterally adjacent IC dies 415. In some exemplary hybrid bonding embodiments, bridge die 615 is in direct contact with glass substrate 212. Bridge die 615 may only be large enough to overlap a portion of two adjacent IC dies 415, or may be larger so as to extend any lateral distance past edge sidewalls of one or more IC dies 415.

For some embodiments illustrated in FIG. 6A where bridge die 615 is face-to-face with IC dies 415, metallization features within IC layers 416 of bridge die 615 are directly coupled with metallization features within IC layers 416 of two or more IC dies 415. For other embodiments further illustrated in FIG. 6A where bridge die 615 is face-to-back with IC dies 415, metallization features within IC layers 416 of bridge die 615 are directly coupled with TSVs 418 two or more IC dies 415. FIG. 6A further illustrates another embodiment where bridge die 615 is face-to-back with one IC die 415 and face-to-face with another IC die 415.

For hybrid bonded embodiments, metal features of bridge die 615 are fused to those of the IC die 415, the resulting composite, quasi-monolithic structure may comprise a hybrid bonded interface of both metallurgically interdiffused metals and chemically bonded insulators.

Hybrid bonding surfaces of IC dies 415 are substantially co-planar. Bridge die 615 may be aligned to a target location on each of IC dies 415 with any high-resolution alignment tool, for example of the type found on a chip-level bonding tool commercially available through a number of industry suppliers. Direct bonding of bridge die 615 to IC dies 415 may sinter metallization features (e.g., via metal interdiffusion) and also bond dielectric materials (e.g., via Si—O—Si condensation bonds). Any direct bonding technique(s) suitable for the IC die and host substrate may be practiced. Thermo-compression bonding may be at low temperature (e.g., below melting temperature of the interconnects, and more specifically below 100° C.). Direct bonding at room temperature (i.e., compression only) is also possible. Prior to bonding, any of bridge die 615 or IC dies 415 may be pre-processed, for example with a plasma clean, to activate their surfaces for the bonding. Post bonding, selective heating may be performed to make permanent the bond (e.g., by converting a van der waals bond into a sintered Cu—Cu bond through interdiffusion). For selective heating, a laser may be employed to limit heating to a specific one IC die 415 and/or bridge die 615.

Lateral (e.g., x-axis) misalignment or misregistration between conductive features of bridge die 615 and IC dies 415 may be less than 0.2 μm. However, lateral misalignment between one conductive feature (e.g., a line or trace) and another conductive feature (e.g., a via) within a monolithic IC die may be at least an order of magnitude smaller than the lateral misalignment between bonded conductive features. The lateral dimensions of metallization features at the bond interface are therefore sufficiently large to accommodate such lateral offset.

For solder bonded embodiments, metal features of bridge die 615 are coupled to those of the IC die 415 with an intervening solder feature (not depicted). Such solder features may comprise any solder alloy (e.g., SAC) as embodiments are not limited in this respect.

In the example illustrated in FIG. 6A, following die attached, bridge die 615 is encapsulated in package dielectric material 618. Package dielectric material 618 may be overmolded around bridge die 615, for example. In some embodiments, an epoxy resin is applied with a molding process to encapsulate bridge die 615. The mold material may be applied to fully encapsulate sidewalls and back-side surface of bridge die 615. Upon curing, package dielectric material 618 may support workpiece 200, enabling carrier 201 to then be removed to expose an opposite side of IC dies 415. For embodiments where bridge die 615 is soldered to IC die 415, an underfill material (not depicted) may present between the solder features.

Figure 6B:
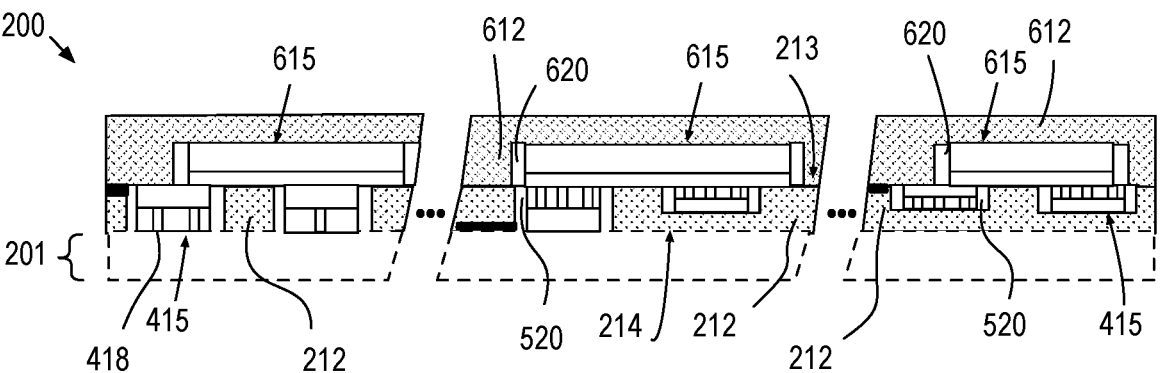

FIG. 6B illustrates an alternative embodiment where bridge die 615 is embedded within a glass substrate 612. For such embodiments, bridge die 615 may have been assembled into glass substrate 612 substantially as described above for IC dies 415. Accordingly, glass substrate 612 may have any of the properties described above for glass substrate 212. A filler 620 between edges of bridge die 615 and glass substrate 612 may similarly have any of the properties described above for filler 520. In some embodiments, glass substrate 612 is substantially the same as glass substrate 212. For hybrid bonding embodiments, in addition to bridge die 615 being directly bonded to IC dies 415, glass substrate 612 may be directly bonded to glass substrate 212. Although embodiments including glass substrate 612 are well suited to hybrid bonding, solder bonding is also possible in which case an underfill (not depicted) may be present between the solder features and within any gap between glass substrates 212 and 612, as stood off by the solder features.

Notably, the treatment of the IC die and bridge die may be exchanged between blocks 130 and 135 (FIG. 1). For example, at block 130 a bridge die may be embedded within a cavity of a glass substrate at block 130 (substantially as illustrated in FIG. 6B). IC die to be interconnected by the bridge die may be attached at block 135 in substantially the same manners as described above (e.g., direct bonding or solder bonding). Where both the bridge die and the IC die are embedded within a glass substrate, the resulting multichip devices will be substantially the same regardless of whether the IC die or a bridge die initiated the "die-first"

methods 101. For other embodiments, where only the die that initiate the "die-first" methods 101 is embedded in a glass substrate, the location of the glass substrate within a multi-chip device is indicative of which of the IC die or bridge die was processed at block 130.

Methods 101 continue at block 140 where package dielectric(s) and redistribution layer (RDL) features are formed on a second (opposite) side of the work piece following carrier removal. Formation of RDL features at block 140 is optional and need not be performed for embodiments where the second side of a glass substrate is merely to be directly bonded or soldered to a substrate package. Regardless, when the carrier is removed, an additional (e.g., backside) planarization process may be performed for embodiments where removal of the carrier does not also expose the IC dies. For example, where the IC die cavities do not extend through the entire thickness of the glass substrate, a portion of the glass substrate underlying the IC die may be removed with a planarization process (e.g., grind or polish) to expose a second side of the IC die. In other examples, even where the IC die cavities do extend through the entire thickness of the glass-section substrate, a back side of the glass substrate may be planarized along with any bond/adhesion material that adhered the IC die within the glass cavity.

In exemplary embodiments, the RDL features formed at block 140 comprise metallization features fanning out I/O from the IC dies to interconnect interfaces that are to interconnect to a host of the multi-chip device. The number of layers and/or thicknesses of RDL metallization may vary according to implementation and needs of the particular IC die.

Figure 7:
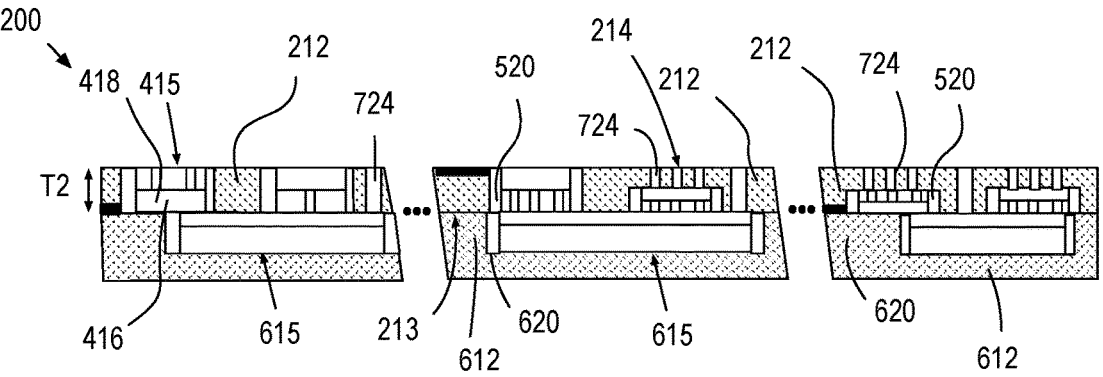

In the example shown in FIG. 7, carrier 201 has been removed from workpiece 200 and optional electrically conductive through-glass vias (TGVs) 724 formed through the entire glass thickness T2. For some embodiments illustrated in FIG. 7 where a thin IC die 415 is recessed within a cavity that does not extend through the glass thickness T2, TGVs 724 may also be formed through any partial thickness of glass substrate 212 to reveal interconnect features on the thin IC die 415. TGVs 724 may have any architecture and generally include a metallization, such as, but not limited to, Cu. TGVs 724 may be fabricated as part of methods 101 (FIG. 1), for example after carrier removal as illustrated. Alternatively, TGVs 724 may be prefabricated in a glass substrate received as an input to methods 101. Regardless, TGVs 724 may be formed, for example, with a milling, ablation, or etching process similar to any that may be enlisted to form the IC die cavities within glass substrate 212. Metallization may be then deposited in the through via openings, for example with a plating process.

Figure 8:
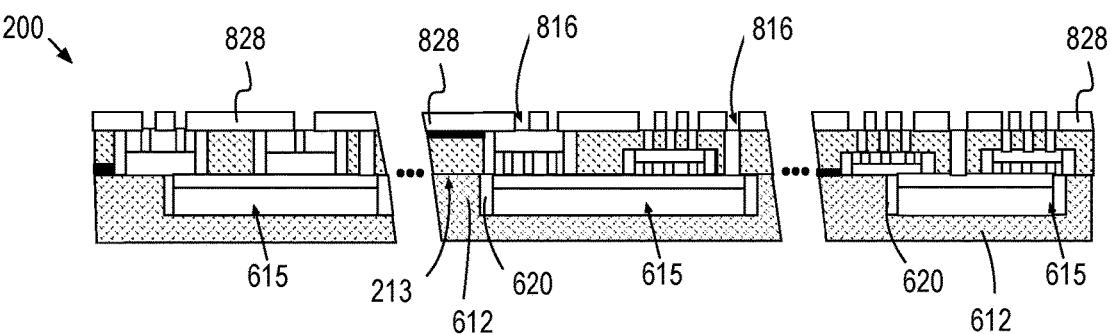

FIG. 8 illustrates workpiece 200 evolving to further include a first package dielectric 828 formed in contact with both a second side of the IC dies 415 and in contact with a second side of glass substrate 212. In exemplary embodiments, package dielectric 828 is an organic material, such as, an epoxy resin, phenolic-glass, or a resinous film such as the GX-series films commercially available from Ajinomoto Fine-Techno Co., Inc. (ABF). Package dielectric 828 may comprise epoxy resins (e.g., an acrylate of novolac such as epoxy phenol novolacs (EPN) or epoxy cresol novolacs (ECN)). In some specific examples, package dielectric 828 is a bisphenol-A epoxy resin, for example including epichlorohydrin. In other examples, package dielectric 828 includes bisphenol-F epoxy resin (with epichlorohydrin). In other examples, package dielectric 828 includes aliphatic epoxy resin, which may be monofunctional (e.g., dodecanol glycidyl ether), difunctional (butanediol diglycidyl ether), or have higher functionality (e.g., trimethylolpropane trigly-cidyl ether). In still other examples, package dielectric 828 includes glycidylamine epoxy resin, such as triglycidyl-p-aminophenol (functionality 3) and N,N,N',N'-tetraglycidyl-bis-(4-aminophenyl)-methane (functionality 4). Depending on the embodiment, package dielectric 828 may be any of a molding compound, a spin-on material, or dry film laminate material, for example. Package dielectric 828 may be intro-duced wet/uncured into a cast and then dried/cured. Alter-natively, package dielectric 828 may be introduced as a semi-cured dry film that is fully cured followings its appli-cation to workpiece 200.

As further illustrated in FIG. 8, openings 816 may be formed through package dielectric 828 to expose metalliza-tion features of either an uppermost one of metallization layer within device layers 416 or to expose TSVs 418, depending on the orientation IC dies 415 were assembled into glass substrate 212. Openings 816 may also expose TGVs 724. Any technique suitable for the composition of package dielectric 828 may be employed to form openings 816. For embodiments where package dielectric 828 is photosensitive, a lithographic process may directly pattern package dielectric 828. Alternatively, a photolithographic masking process may be performed and package dielectric 828 etched according to the mask. In other embodiments, openings 816 may be ablated, for example with a laser.

Figure 9:
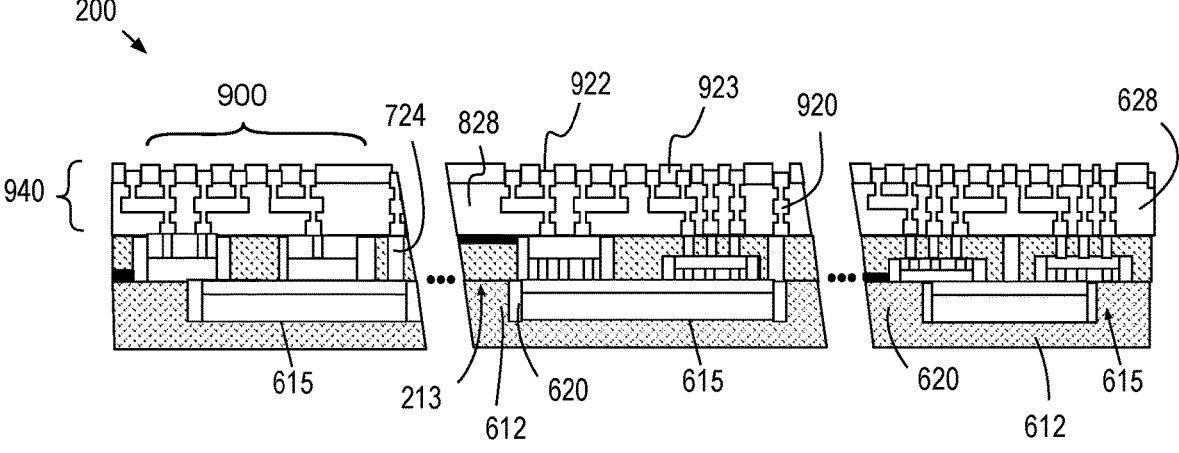

FIG. 9 further illustrates a complete package routing structure 940 built-up workpiece 200. Package routing struc-ture 940 comprises RDL metallization features 920 that backfill openings in one or more layers of package dielectric 828. There may be any number of RDL metallization features 920 built up on a second side of workpiece 200. In the embodiment illustrated, RDL metallization features 940 terminate with first-level interconnect interfaces 922. RDL metallization features 920 may therefore be built up on a backside or frontside of IC dies 415 depending on which side of the IC dies 415 is coupled to bridge die 615. In the example illustrated in FIG. 9, interconnect interfaces 922 are pillars or pads surrounded by a solder resist 923. Hence, in accordance with the illustrated embodiment, routing struc-ture 940 fan-outs interconnections of the multiple IC dies 415 for further coupling with an external host (not depicted). Routing structure 940 may also be further coupled to bridge die 615, for example through TGVs 724, Accordingly, interconnection between IC dies 415 need not be exclusively through bridge die 615.

Conductive RDL metallization features 920 may be formed with an additive or semi-additive process, for example. In some embodiments, each layer of RDL metal-lization features 920 are formed by first depositing a seed layer (e.g., Cu) and then forming a plating resist mask (not depicted) over the seed layer. With an electrolytic deposition process, Cu is plated upon the seed layer wherever the resist mask is absent. Accordingly, RDL metallization features 920 may have substantially the same composition (e.g., predomi-nantly Cu). The building up of RDL metallization features 920 may comprise any number of cycles with each cycle including package dielectric application, patterning of the package dielectric, and plating of conductive features upon the patterned package dielectric.

Although FIG. 7-9 are illustrated in the context of work-piece 200 evolving from the embodiment illustrated in FIG. 6B, workpiece 200 may instead evolve from the embodi-ment illustrated in FIG. 6A in substantially the same manner as illustrated in FIG. 7-9 with only a difference in the material surrounding edges of bridge die 615.

Returning to FIG. 1, methods 101 end with the comple-tion of the multi-chip device package structures. In accor-dance with some embodiments, first level interconnects (FLI) may be formed on exposed surfaces of conductive features of the package structures in preparation for pack-aging or assembly. In exemplary embodiments, solder fea-tures are formed as the FLI. The multi-chip device package structures may then be singulated according to any tech-niques known to be suitable for glass substrates. Multi-chip device structures may be separated by kerf or panel frame with each multi-chip device including at least two IC dies that are interconnected to each other through a bridge die attached to a side of the IC dies opposite the first-level interconnect interfaces.

Figure 10:
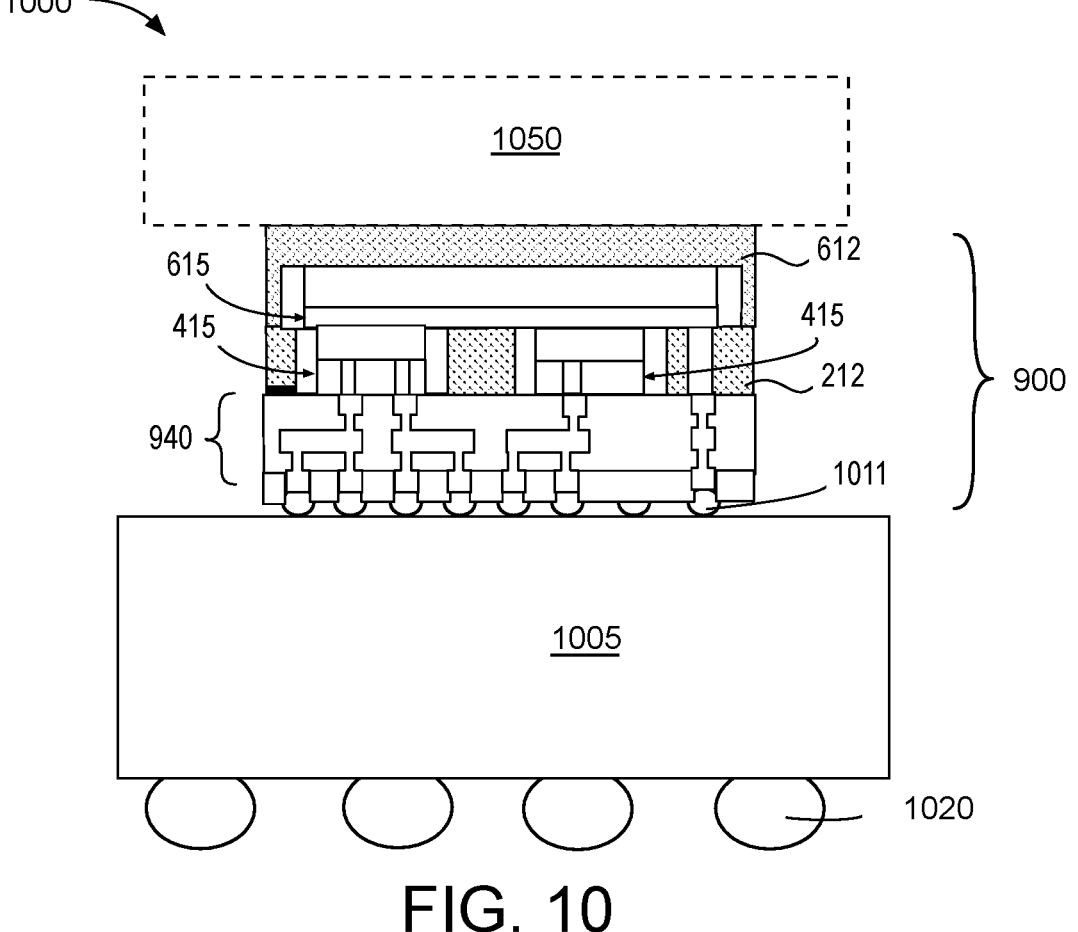
FIG. 10 illustrates a system including one of the multi-chip devices illustrated in FIG. 9 attached to a host component with FLI features, in accordance with some embodiments.

FIG. 10 illustrates a system including multi-chip device structure 1000 attached to a host component 1005 by reflow-ing FLI interconnects 1011. In exemplary embodiments, FLI interconnects 1011 are solder (e.g., SAC) microbumps although other interconnect features are also possible. Host component 1005 may also comprise one or more materials known to be suitable as interposers or package substrates (e.g., an epoxy preform, cored or coreless laminate board, etc.). Host component 1005 may include one or more metallized redistribution levels (not depicted) embedded within a dielectric material. Host component 1005 may also include one or more IC die embedded therein.

Host component 1005 may further include second level interconnects (SLI) 1020. SLI 1020 may comprise any solder (ball, bump, etc.) suitable for a given host board architecture (e.g., surface mount FR4, etc.). As illustrated in dashed line, one or more heat spreaders and/or heat sinks 1050 may be further coupled to multi-chip device 900, which may be advantageous, for example, where IC dies 415 comprise one or more CPU cores or other circuitry of similar power density.

Figure 11:
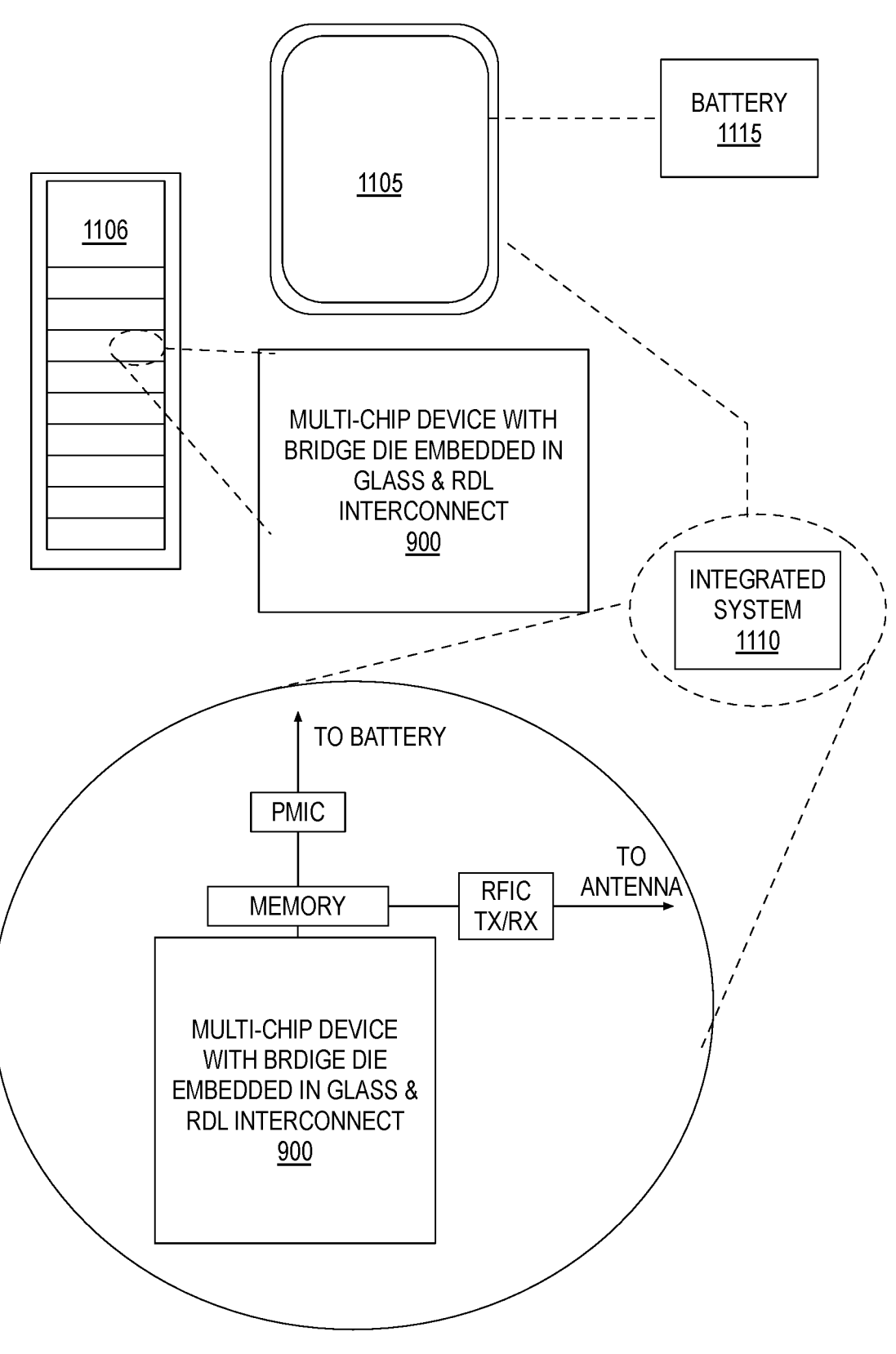
FIG. 11 illustrates a mobile computing platform and a data server machine employing a multi-chip package, in accordance with some embodiments.

FIG. 11 illustrates a mobile computing platform 1105 and a data server machine 1106 employing a multi-chip IC device with die embedded in a glass substrate and intercon-nected with a bridge die on one side and redistribution layer metallization features on the opposite side, for example as described elsewhere herein. Server machine 1106 may be any commercial server, for example including any number of high-performance computing platforms disposed within a rack and networked together for electronic data processing, which in the exemplary embodiment includes multichip device 900, for example as described elsewhere herein. The mobile computing platform 1105 may be any portable device configured for each of electronic data display, elec-tronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), an integrated system 1110, and a battery 1115.

As illustrated in the expanded view, multi-chip device 900 is coupled to one or more of a power management integrated circuit (PMIC) or RF (wireless) integrated circuit (RFIC) including a wideband RF (wireless) transmitter and/or receiver. A PMIC may perform battery power regulation, DC-to-DC conversion, etc., and so has an input coupled to battery 1115 and with an output providing a current supply to other functional modules. As further illustrated, in the exemplary embodiment, an RFIC has an output coupled to an antenna (not shown) to implement any of a number of wireless standards or protocols, including but not limited to Wi-Fi (IEEE 802.11 family), WiMAX (IEEE 802.16 fam-ily), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, and beyond.

Figure 12:
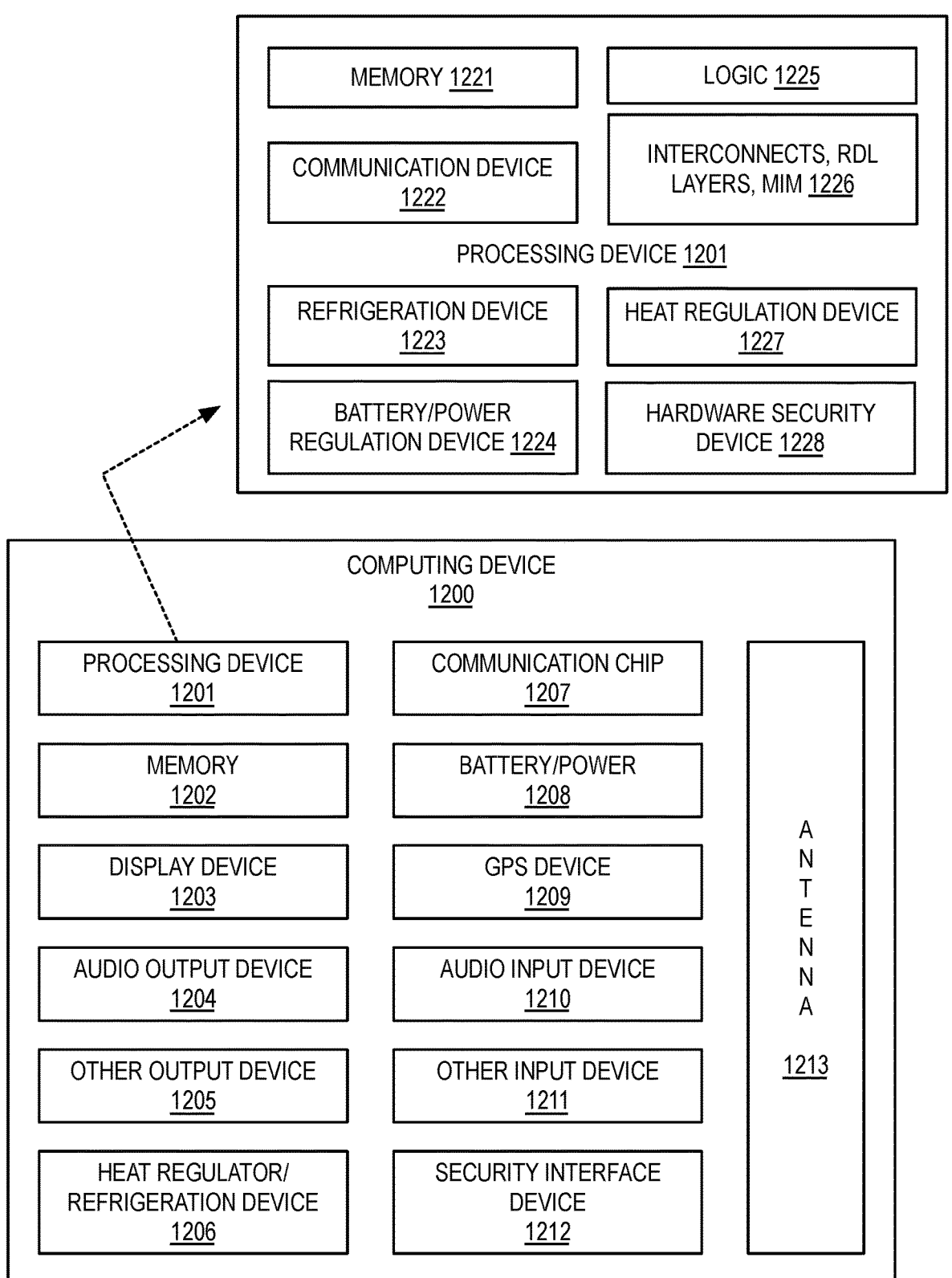
FIG. 12 is a functional block diagram of an electronic computing device, in accordance with some embodiments.

FIG. 12 is a block diagram of a cryogenically cooled computing device 1200 in accordance with some embodiments. For example, one or more components of computing device 1200 may include any of the devices or structures discussed elsewhere herein. A number of components are illustrated in FIG. 12 as included in computing device 1200, but any one or more of these components may be omitted or duplicated, as suitable for the application. In some embodiments, some or all of the components included in computing device 1200 may be attached to one or more printed circuit boards (e.g., a motherboard). In some embodiments, various ones of these components may be fabricated onto a single system-on-a-chip (SoC) die. Additionally, in various embodiments, computing device 1200 may not include one or more of the components illustrated in FIG. 12, but computing device 1200 may include interface circuitry for coupling to the one or more components. For example, computing device 1200 may not include a display device 1203, but may include display device interface circuitry (e.g., a connector and driver circuitry) to which display device 1203 may be coupled.

Computing device 1200 may include a processing device 1201 (e.g., one or more processing devices). As used herein, the term processing device or processor indicates a device that processes electronic data from registers and/or memory to transform that electronic data into other electronic data that may be stored in registers and/or memory. Processing device 1201 may include a memory 1221, a communication device 1222, a refrigeration/active cooling device 1223, a battery/power regulation device 1224, logic 1225, interconnects 1226, a heat regulation device 1227, and a hardware security device 1228.

Processing device 1201 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1201 may include a memory 1202, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1221 includes memory that shares a die with processing device 1202. This memory may be used as cache memory and may include embedded dynamic random-access memory (eDRAM) or spin transfer torque magnetic random-access memory (STT-M RAM).

Computing device 1200 may include a heat regulation/refrigeration device 1206. Heat regulation/refrigeration device 1206 may maintain processing device 1202 (and/or other components of computing device 1200) at a predetermined low temperature during operation. This predetermined low temperature may be any temperature discussed elsewhere herein.

In some embodiments, computing device 1200 may include a communication chip 1207 (e.g., one or more communication chips). For example, the communication chip 1207 may be configured for managing wireless communications for the transfer of data to and from computing device 1200. The term "wireless" and its derivatives may be used to describe circuits, devices, systems, methods, techniques, communications channels, etc., that may communicate data through the use of modulated electromagnetic radiation through a nonsolid medium.

Communication chip 1207 may implement any wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1207 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1207 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1207 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1207 may operate in accordance with other wireless protocols in other embodiments. Computing device 1200 may include an antenna 1213 to facilitate wireless communications and/or to receive other wireless communications (such as AM or FM radio transmissions).

In some embodiments, communication chip 1207 may manage wired communications, such as electrical, optical, or any other suitable communication protocols (e.g., the Ethernet). As noted above, communication chip 1207 may include multiple communication chips. For instance, a first communication chip 1207 may be dedicated to shorter-range wireless communications such as Wi-Fi or Bluetooth, and a second communication chip 1207 may be dedicated to longer-range wireless communications such as GPS, EDGE, GPRS, CDMA, WiMAX, LTE, EV-DO, or others. In some embodiments, a first communication chip 1207 may be dedicated to wireless communications, and a second communication chip 1207 may be dedicated to wired communications.

Computing device 1200 may include battery/power circuitry 1208. Battery/power circuitry 1208 may include one or more energy storage devices (e.g., batteries or capacitors) and/or circuitry for coupling components of computing device 1200 to an energy source separate from computing device 1200 (e.g., AC line power).

Computing device 1200 may include a display device 1203 (or corresponding interface circuitry, as discussed above). Display device 1203 may include any visual indicators, such as a heads-up display, a computer monitor, a projector, a touchscreen display, a liquid crystal display (LCD), a light-emitting diode display, or a flat panel display, for example.

Computing device 1200 may include an audio output device 1204 (or corresponding interface circuitry, as discussed above). Audio output device 1204 may include any device that generates an audible indicator, such as speakers, headsets, or earbuds, for example.

Computing device 1200 may include an audio input device 1210 (or corresponding interface circuitry, as discussed above). Audio input device 1210 may include any device that generates a signal representative of a sound, such as microphones, microphone arrays, or digital instruments (e.g., instruments having a musical instrument digital interface (MIDI) output).

Computing device 1200 may include a global positioning system (GPS) device 1209 (or corresponding interface circuitry, as discussed above). GPS device 1209 may be in communication with a satellite-based system and may receive a location of computing device 1200, as known in the art.

Computing device 1200 may include another output device 1205 (or corresponding interface circuitry, as discussed above). Examples include an audio codec, a video codec, a printer, a wired or wireless transmitter for providing information to other devices, or an additional storage device.

Computing device 1200 may include another input device 1211 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1200 may include a security interface device 1212. Security interface device 1212 may include any device that provides security measures for computing device 1200 such as intrusion detection, biometric validation, security encode or decode, managing access lists, malware detection, or spyware detection.

Computing device 1200, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the present disclosure is not limited to the embodiments so described but can be practiced with modification and alteration without departing from the scope of the appended claims. For example, the above embodiments may include specific combinations of features as further provided below.

In first examples, an integrated circuit (IC) device comprises a first IC die adjacent to a second IC die, and a third IC die on a first side of the first and second IC dies. The third IC die comprises metallization features interconnecting the first IC die to the second IC die. The IC device comprises a glass substrate adjacent to the third IC die or adjacent to the first and second IC dies.

In second examples, for any of the first examples the glass substrate is between a sidewall of the first IC die and a sidewall of the second IC die. The third IC die is in direct contact with a portion of the first IC die and the second IC die.

In third examples, for any of the second examples a thickness of the glass substrate is substantially equal to a thickness of at least one of the first and second IC dies.

In fourth examples, for any of the second through third examples the glass substrate is thicker than at least one of the first and second IC dies, and a host component is coupled to the at least one of the first or second IC dies by a conductive through glass via.

In fifth examples, for any of the second through fourth examples the IC device comprise a package dielectric material or a second glass substrate adjacent to the third IC die.

In sixth examples, for any of the first through fifth examples the IC device further comprises a routing structure on a second side of the first and second IC dies, opposite the first side. The routing structure comprises second metallization features interconnecting each of the first and second IC dies to first-level package interconnect interfaces.

In seventh examples, for any of the first through sixth examples the glass substrate is adjacent to the third IC die and wherein the IC device further comprises a package dielectric material or a second glass substrate between a sidewall of the first IC die and a sidewall of the second IC die.

In eighth examples, for any of the first through seventh examples the metallization features comprise a first plurality of features directly bonded to metallization features of the first IC die and a second plurality of features directly bonded to metallization features of the second IC die.

In ninth examples, for any of the first through eighth examples the metallization features comprise a first plurality of features interconnected by solder to metallization features of the first IC die and a second plurality of features interconnected by solder to metallization features of the second IC die.

In tenth examples, for any of the first through ninth examples each of the first and second IC dies further comprises a device layer over a die substrate and one or more conductive vias extending through the die substrate, the conductive vias coupling the device layer to the third IC die or to the routing structure.

In eleventh examples, for any of the tenth examples the third IC die is directly coupled to the device layer, and a routing structure is coupled to the device layer through the conductive vias.

In twelfth examples, for any of the tenth examples the routing structure is directly coupled to the device layer and the third IC die is coupled to the device layer through the conductive vias.

In thirteenth examples, a system comprises a plurality of laterally adjacent IC dies, an interconnect bridge die on a first side of the adjacent IC dies, the interconnect bridge die comprising first metallization features interconnecting the plurality of laterally adjacent IC die. The system comprises a glass substrate material between edge sidewalls of the plurality of adjacent IC dies and a routing structure on a second side of the plurality of adjacent IC dies. The routing structure spanning a portion of the glass substrate material, and comprising second metallization features interconnecting the plurality of adjacent IC dies to first-level interconnect features.

In fourteenth examples, for any of the thirteenth examples the system further comprises a host component interconnected to the first routing structure through first-level interconnects coupled to the first-level interconnect features.

In fifteenth examples for any of the fourteenth examples the first-level interconnect features comprise solder.

In sixteenth examples, for any of the thirteenth through fifteenth examples a power supply coupled through the host component to provide power to the plurality of adjacent IC dies.

In seventeenth examples, a method of assembling an integrated circuit (IC) device, the method comprises placing a first IC die and a second IC die within one or more recesses in a glass substrate, and attaching a third IC die to metallization features on a first side of the first IC die and the second IC die. The third IC die span a portion of the glass substrate between the first and second IC dies.

In eighteenth examples, for any of the seventeenth examples the method further comprises building up second metallization features within a dielectric material on a second side, opposite the first side, of the first and second IC dies and the glass substrate. The second metallization features electrically couple the first and second IC die to first level interconnect interfaces.

In nineteenth examples, for any of the eighteenth examples building up the dielectric material comprises a dry film lamination or spin-on application of an organic material.

In twentieth examples, for any of the seventeenth through eighteenth examples attaching the third IC die further comprises attaching a second glass substrate to the first glass substrate, the third IC die embedded within a recess in the second glass substrate.

In twenty-first examples, for any of the seventeenth through twentieth examples attaching the third IC die further comprises soldering or directly bond metallization features of the third IC die to the first metallization features.

In twenty-second examples, for any of the seventeenth through twenty-first examples the method further comprises molding a package dielectric material over the third IC die after attaching the third IC die.

In twenty-third examples, for any of the seventeenth through twenty-second examples the method further comprises forming a conductive through via through a portion of the glass substrate adjacent to at least one of the first or second IC dies, and planarizing a surface of the glass substrate with at least one of the conductive through vias, first IC die or second IC die However, the above embodiments are not limited in this regard, and, in various implementations, the above embodiments may include the undertaking of only a subset of such features, undertaking a different order of such features, undertaking a different combination of such features, and/or undertaking additional features than those features explicitly listed. The scope of the present disclosure should therefore be determined with reference to the appended claims, along with the full scope of equivalents to which such claims are entitled.

What is claimed is:

1. An integrated circuit (IC) device, comprising:
a first IC die adjacent to a second IC die;
a third IC die on a first side of the first and second IC dies, wherein the third IC die comprises metallization features interconnecting the first IC die to the second IC die, and wherein the third IC die is in direct contact with a portion of the first IC die and the second IC die;
a glass substrate adjacent to the first and second IC dies and coplanar with the first sides of the first and second IC dies, wherein the glass substrate is between a sidewall of the first IC die and a sidewall of the second IC die; and
a routing structure on a second side of the glass substrate and a second side of the first and second IC dies, the routing structure comprising second metallization features interconnecting the second sides of each of the first and second IC dies to interconnect interfaces.

2. The IC device of claim 1, wherein a thickness of the glass substrate is substantially equal to a thickness of at least one of the first and second IC dies.

3. The IC device of claim 2, wherein the glass substrate is thicker than at least one of the first and second IC dies, and a host component is coupled to the at least one of the first or second IC dies by a conductive through glass via.

4. The IC device of claim 1, further comprising a package dielectric material adjacent to the third IC die.

5. The IC device of claim 4, wherein the package dielectric is in direct contact with a portion of the glass substrate and in direct contact with a sidewall of the third IC die.

6. The IC device of claim 1, wherein the routing structure is in direct contact with the glass substrate.

7. The IC device of claim 1, wherein the metallization features comprise a first plurality of features directly bonded to metallization features of the first IC die and a second plurality of features directly bonded to metallization features of the second IC die.

8. The IC device of claim 1, wherein the metallization features comprise a first plurality of features interconnected by solder to metallization features of the first IC die and a second plurality of features interconnected by solder to metallization features of the second IC die.

9. The IC device of claim 1, wherein the glass substrate is in direct contact with a portion of the third IC die spanning a distance between adjacent edges of the first and second IC dies.

10. An integrated circuit (IC) device, comprising:
a first IC die adjacent to a second IC die;
a third IC die on a first side of the first and second IC dies, wherein the third IC die comprises metallization features interconnecting the first IC die to the second IC die, wherein each of the first and second IC dies further comprises a device layer over a die substrate and one or more conductive vias extending through the die substrate;
a glass substrate adjacent to the first and second IC dies and coplanar with the first sides of the first and second IC dies; and
a routing structure on a second side of the glass substrate and a second side of the first and second IC dies, the routing structure comprising second metallization features interconnecting the second sides of each of the first and second IC dies to interconnect interfaces, wherein the conductive vias couple the device layer to the third IC die or to the routing structure.

11. The IC device of claim 10, wherein the third IC die is directly coupled to the device layer, and the routing structure is coupled to the device layer through the conductive vias.

12. The IC device of claim 10, wherein the routing structure is directly coupled to the device layer and the third IC die is coupled to the device layer through the conductive vias.

13. A system comprising:
a plurality of laterally adjacent IC dies;
an interconnect bridge die on a first side of the laterally adjacent IC dies, the interconnect bridge die comprising first metallization features interconnecting the plurality of laterally adjacent IC die;

a glass substrate material between edge sidewalls of the plurality of adjacent IC dies, the glass substrate material coplanar with the first side of the laterally adjacent IC dies, wherein the glass substrate is in direct contact with a portion of the interconnect bridge die spanning a distance between adjacent edges of the IC dies; and a routing structure on a second side of the plurality of adjacent IC dies, opposite the interconnect bridge die, the routing structure spanning a portion of the glass substrate material, and comprising second metallization features interconnecting the plurality of adjacent IC dies to interconnect features.

14. The system of claim 13, further comprising:

a host component interconnected to the routing structure through first-level interconnects coupled to the interconnect features.

15. The system of claim 13, wherein the interconnect features comprise solder.

16. The system of claim 13, further comprising:

a host component interconnected to the first routing structure through first-level interconnects coupled to the interconnect features; and a power supply coupled through the host component to provide power to the plurality of adjacent IC dies.

17. The system of claim 13, further comprising a package dielectric material adjacent to the interconnect bridge die.

18. The system of claim 17, wherein the package dielectric is in direct contact with a portion of the glass substrate and in direct contact with a sidewall of the interconnect bridge die.

* * * * *